(12) United States Patent
Holden et al.

(10) Patent No.: US 9,177,782 B2
(45) Date of Patent: Nov. 3, 2015

(54) METHODS AND APPARATUS FOR CLEANING A SUBSTRATE

(71) Applicant: APPLIED MATERIALS, INC., Santa Clara, CA (US)

(72) Inventors: James Matthew Holden, San Jose, CA (US); Song-Moon Suh, Sunnyvale, CA (US); Shalina D. Sudheeran, San Jose, CA (US); Glen T. Mori, Gilroy, CA (US)

(73) Assignee: APPLIED MATERIALS, INC., Santa Clara, CA (US)

( * ) Notice: Subject to any disclaimer, the term of this patent is extended or adjusted under 35 U.S.C. 154(b) by 8 days.

(21) Appl. No.: 13/785,834

(22) Filed: Mar. 5, 2013

(65) Prior Publication Data

US 2014/0251374 A1 Sep. 11, 2014

(51) Int. Cl.
*H01L 21/02* (2006.01)
*H01L 21/67* (2006.01)

(52) U.S. Cl.
CPC ...... *H01L 21/02101* (2013.01); *H01L 21/0209* (2013.01); *H01L 21/02057* (2013.01); *H01L 21/67051* (2013.01)

(58) Field of Classification Search
None
See application file for complete search history.

(56) References Cited

U.S. PATENT DOCUMENTS

| | | | |
|---|---|---|---|
| 5,679,062 A * | 10/1997 | Goenka | 451/75 |
| 5,836,809 A * | 11/1998 | Kosic | 451/89 |
| 6,066,032 A | 5/2000 | Borden et al. | |
| 6,129,451 A | 10/2000 | Rosio et al. | |
| 6,343,609 B1 * | 2/2002 | Kim | 134/1.3 |
| 6,684,523 B2 | 2/2004 | Bailey et al. | |
| 6,725,564 B2 | 4/2004 | Hunter et al. | |
| 6,779,226 B2 | 8/2004 | Hunter et al. | |
| 6,851,148 B2 | 2/2005 | Preston et al. | |
| 2007/0202446 A1 * | 8/2007 | Takahashi et al. | 430/329 |
| 2012/0152276 A1 | 6/2012 | Pagliaro et al. | |
| 2012/0247504 A1 * | 10/2012 | Nasr et al. | 134/1.1 |
| 2014/0117029 A1 * | 5/2014 | Harvey | 220/660 |

OTHER PUBLICATIONS

U.S. Appl. No. 13/785,903, filed Mar. 5, 2013, Holden et al.
Pandit et al., "Using Ionizers to Reduce Electrostatically Adhered Particles on Wafer Backside", IEEE Transactions on Semiconductor Manufacturing, vol. 24, No. 2, May 2011. pp. 158-164.
International Search Report and Written Opinion mailed Jun. 23, 2014 for PCT Application No. PCT/US2014/018180.

* cited by examiner

*Primary Examiner* — Michael Kornakov
*Assistant Examiner* — Pradhuman Parihar
(74) *Attorney, Agent, or Firm* — Moser Taboada; Alan Taboada

(57) ABSTRACT

A substrate cleaning apparatus may include a substrate support member to support a substrate having a first side and a contaminated second side; a liquid carbon dioxide source; a gaseous carbon dioxide source; and one or more nozzles coupled to the liquid carbon dioxide source and to the gaseous carbon dioxide source, wherein the one or more nozzles are configured to receive liquid carbon dioxide and to discharge a first mixture of solid and gaseous carbon dioxide from the liquid carbon dioxide source to the second side of the substrate and to receive gaseous carbon dioxide and to discharge a second mixture of solid and gaseous carbon dioxide from the gaseous carbon dioxide source to the second side of the substrate. Methods of cleaning a substrate may be performed in the substrate cleaning apparatus.

8 Claims, 7 Drawing Sheets

METHODS AND APPARATUS FOR CLEANING A SUBSTRATE

FIELD

Embodiments of the present invention generally relate to semiconductor processing equipment.

BACKGROUND

A semiconductor substrate is handled on its edge and backside numerous times during the manufacturing process, for example during metal deposition, chemical vapor deposition, or etching processes. Such handling can cause contaminants to adhere to the backside of the substrate and travel from chamber to chamber, substrate to substrate, FOUP to FOUP, or process tool to process tool along with the substrate. These contaminants can migrate to the front side of the substrate, resulting in yield loss. Alternatively, the contaminants can cause the substrate to not lay flat on a substrate support in a process tool. For example, in a lithography step, the contaminants can undesirably cause a substrate to lay unevenly atop a support stage in a lithography tool beyond a working depth of field of the stepper lens.

Typical solutions to this problem have been to remove the contaminants through an in-production-line cleaning tool using wet chemicals, backside scrubbing, attempts to limit particle formation, and/or frequent cleaning of process tools. However, these steps only mitigate the yield loss and are costly in terms of equipment and consumables. For example, use of wet chemicals requires wet chemistry handling and disposal, and possible undesired damage to the backside of the substrate.

As such, the inventors have provided improved methods and apparatus for cleaning particle contamination from a substrate.

SUMMARY

Embodiments of methods of cleaning contaminants from a substrate are disclosed herein. In some embodiments, a substrate cleaning apparatus may include a substrate support member to support a substrate having a first side and a contaminated second side; a liquid carbon dioxide source; a gaseous carbon dioxide source; and one or more nozzles coupled to the liquid carbon dioxide source and to the gaseous carbon dioxide source, wherein the one or more nozzles are configured to receive liquid carbon dioxide and to discharge a first mixture of solid and gaseous carbon dioxide from the liquid carbon dioxide source to the second side of the substrate and to receive gaseous carbon dioxide and to discharge a second mixture of solid and gaseous carbon dioxide from the gaseous carbon dioxide source to the second side of the substrate.

In some embodiments, a method of cleaning contaminants from a substrate disposed atop a substrate support member is provided. In some embodiments a method of cleaning contaminants from a substrate disposed within a substrate cleaning chamber, wherein the substrate has a first side and a second side, may include (a) directing a first mixture of solid and gaseous carbon dioxide from a liquid carbon dioxide source to the second side of the substrate to remove one or more contaminants from the second side of the substrate, wherein the first mixture leaves a first residue; and (b) directing a second mixture of solid and gaseous carbon dioxide from a gaseous carbon dioxide source to the second side of the substrate to remove at least some of the first residue, wherein the first mixture contains a greater amount of solid carbon dioxide than the second mixture.

Other and further embodiments of the present invention are described below.

BRIEF DESCRIPTION OF THE DRAWINGS

Embodiments of the present invention, briefly summarized above and discussed in greater detail below, can be understood by reference to the illustrative embodiments of the invention depicted in the appended drawings. It is to be noted, however, that the appended drawings illustrate only typical embodiments of this invention and are therefore not to be considered limiting of its scope, for the invention may admit to other equally effective embodiments.

DETAILED DESCRIPTION

Embodiments of the invention provide improved methods and apparatus for cleaning a substrate. Embodiments of the present invention may advantageously allow for the removal of contamination accumulated on a substrate during the manufacturing process, such as while handling the substrate between process steps and while chucking the substrate inside a process chamber, which can limit or prevent contaminants from reaching the front-side of a substrate and causing yield loss. Embodiments of the present invention may advantageously allow for the removal of the contamination without the potential damage to the substrate associated with contact cleaning or wet cleaning. Embodiments of the present invention may be used on a wide variety of cleaning surfaces where very high particle removal plus very low addition of particles are required, for example, in display processing, silicon chip packaging, hard disk media cleaning, and optics manufacturing.

Figure 1:
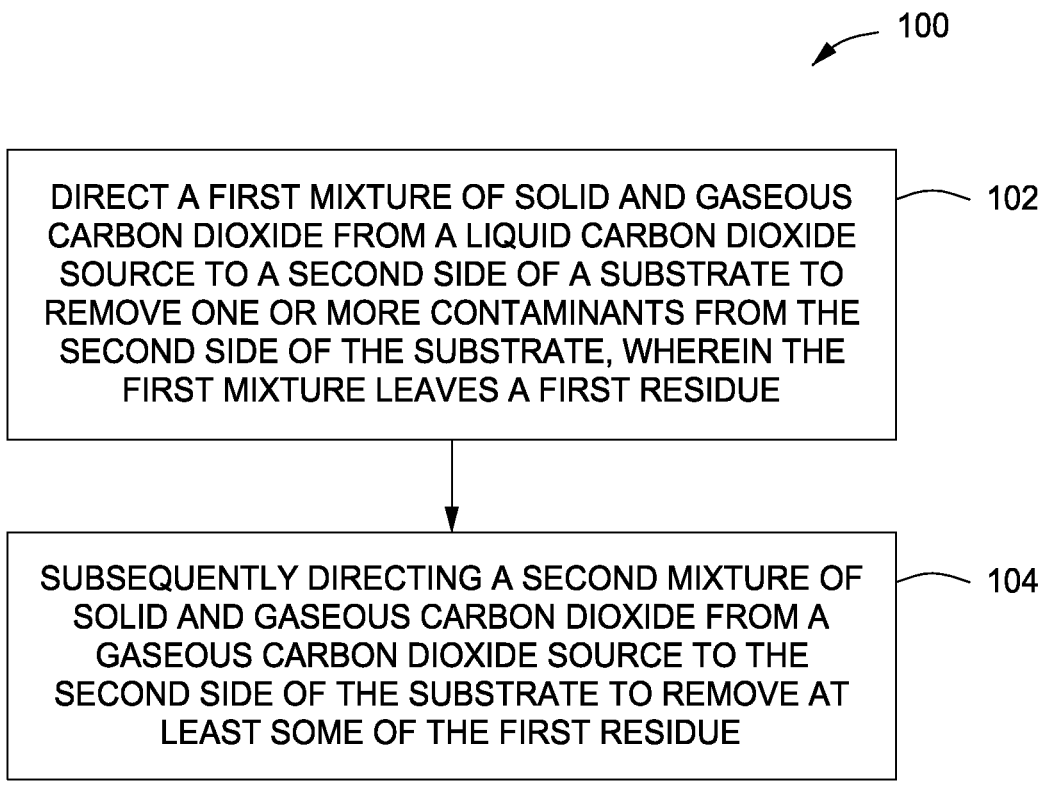
FIG. 1 depicts a flow chart for a method of cleaning a substrate in accordance with some embodiments of the present invention.
Figure 2:
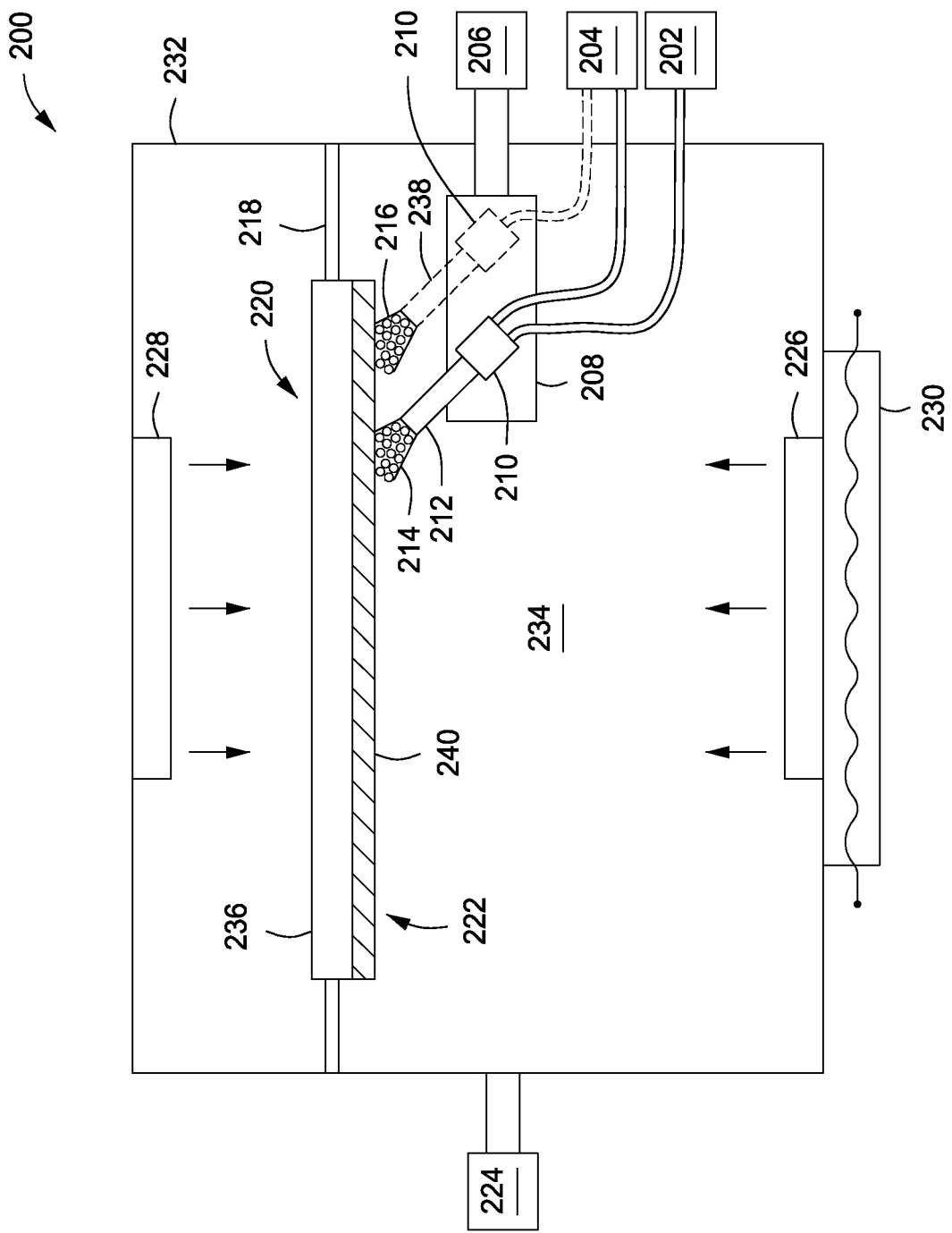
FIG. 2 depicts a schematic view of a substrate cleaning apparatus in accordance with some embodiments of the present invention.

FIG. 1 depicts a flow chart for a method 100 of cleaning a substrate in accordance with some embodiments of the present invention. In some embodiments, at least some portions of the method 100 may be performed in a substrate cleaning apparatus, for example, such as the apparatus 200 described below with respect to FIG. 2.

The particular embodiment of the substrate cleaning apparatus 200 shown herein is provided for illustrative purposes and should not be used to limit the scope of the invention. The substrate cleaning apparatus 200 depicted in FIG. 2 generally comprises a substrate support member 218 to support a substrate 220. In some embodiments, the substrate support member is disposed within an optional process chamber 232 having a first volume 234. In other embodiments, the substrate support member 218 may be disposed in any suitable location to support a substrate to be cleaned without being disposed in a chamber. In some embodiments, the substrate cleaning apparatus also comprises a heat source 230, such as a tungsten lamp, to heat the substrate 220.

The substrate 220 may be any suitable substrate used in a semiconductor or similar thin-film manufacturing processes, such as circular, square, rectangular, or other shaped substrates of various materials. In some embodiments, the substrate 200 may be a semiconductor wafer (e.g., a 200 mm, 300 mm, 450 mm, or the like silicon wafer). The substrate 220 to be cleaned generally includes an uncontaminated first side 236 and a contaminated second side 222. In some embodiments, the substrate support member 218 grips the substrate 220 by an outer edge of the substrate 220 without gripping the first side 236, in order to prevent contamination of the first side 236, and without gripping the second side 222, in order to allow full access to the second side 222 of the substrate 220.

Below the substrate 220 is a first nozzle 212 coupled to a moveable arm 208. The moveable arm is coupled to an actuator 206 to facilitate movement of the movable arm 208. The first nozzle 212 is coupled to a liquid carbon dioxide source 202. The first nozzle 212 discharges a first mixture 214 comprising a stream of solid carbon dioxide entrained in a stream of gaseous carbon dioxide to the second side 222 of the substrate 220. In some embodiments, the liquid carbon dioxide passes through a fine mesh filter 210 (e.g., a nickel mesh filter) to advantageously remove gross particulates from the liquid carbon dioxide prior to discharge from the first nozzle 212. As used herein with respect to the mesh filter, "fine" refers to filter having a pore size that is smaller than about one-half the node size of a device being fabricated on the substrate. For example, in some embodiments where the node size is about 22 nm, the fine mesh filter 210 may have a filter pore size of less than about 11 nm.

Application of the first mixture to the contaminated second side 222 removes contaminants 240 from the second side 222. In some embodiments, the liquid carbon dioxide is supplied to the first nozzle 212 at a pressure of about 200 to about 1000 psi, or in some embodiments, about 800 to about 850 psi. In some embodiments, the liquid carbon dioxide is supplied to the first nozzle 212 at a pressure dependent upon the vapor pressure of liquid $CO_2$ at room temperature (e.g., about 25 degrees Celsius). In some embodiments, the first nozzle 212 is a throttling nozzle, which causes an isenthalpic expansion of the liquid carbon dioxide, such that when the carbon dioxide exits the nozzle 212, it expands into the first mixture 214. The first mixture 214 comprises a greater amount of solid carbon dioxide than gaseous carbon dioxide. In some embodiments, the first mixture 214 comprises about 10% to about 50% solid carbon dioxide and about 90% to about 50% gaseous carbon dioxide.

Without wishing to be bound by theory, the inventors believe that the solid carbon dioxide particles strike the contaminants 240 on the second side 222 and change from the solid phase to the gas phase, resulting in an expansion which pushes the contaminants 240 off of the second side 222. However, other physical, chemical, and/or thermal processes that cause the removal of the contaminants 240 are possible. However, while the first mixture 214 is effective in removing the contaminants 240 from the second side 222 of the substrate 220, it also undesirably deposits a layer of residue onto the second side 222. In some embodiments, the residue comprises metals, metal oxides, organic materials, and other dielectric materials.

In some embodiments, to remove the layer of residue deposited by the first mixture 214, the first nozzle 212 is coupled to a gaseous carbon dioxide source 204 and discharges a second mixture 216 comprising a stream of solid carbon dioxide entrained in a stream of gaseous carbon dioxide to the second side 222 of the substrate 220. A switch or other plumbing may be provided to selectively couple the first nozzle 212 to the liquid carbon dioxide source 202 or the gaseous carbon dioxide source 204. In some embodiments, the gaseous carbon dioxide passes through the fine mesh filter 210 (e.g., nickel mesh filter). as described above, to advantageously remove gross particulates from the gaseous carbon dioxide prior to discharge from the first nozzle 212.

Alternatively, in some embodiments, the gaseous carbon dioxide source 204 is coupled to a second nozzle 238 which discharges the second mixture 216 to the second side 222 of the substrate 220. In some embodiments, the second nozzle is coupled to the movable arm 208. In some embodiments, the gaseous carbon dioxide passes through a fine mesh filter 210 (e.g., nickel mesh filter) before being discharged by the second nozzle 238.

Similar to the first nozzle 212, in some embodiments, the second nozzle 238 is a throttling nozzle which causes an expansion of the gaseous carbon dioxide, such that when the gaseous carbon dioxide exits the second nozzle 238, it expands into the second mixture 216. However, the second mixture 216 contains lesser solid carbon dioxide particles, in size as well as in amount, than the first mixture 214. In some embodiments, the second mixture 216 comprises about 1% to about 20% solid carbon dioxide and about 99% to about 80% gaseous carbon dioxide.

The inventors have observed that, due to the lesser amount of solid carbon dioxide particles, the second mixture 216 is less effective than the first mixture 214 in removing contaminants 240 on the second side 222 of the substrate 220. In addition, as discussed above, the inventors have also observed that although better at removing contaminants, a cleaning process that applies only the first mixture 214 undesirably results in a layer of residue from the first mixture 214 adhering to the second side 222 of the substrate 220. However, the inventors have found that a cleaning process using the second mixture 216 is particularly well suited for removing the layer of residue resultant from the cleaning process using the first mixture 214. Thus, the inventors have determined that applying a first mixture 214 from a solid carbon dioxide feed source followed by applying a second mixture 216 from a gaseous carbon dioxide feed source effectively removes contaminants 240 from the second side 222 of the substrate 220 resulting from a substrate manufacturing process and removes at least some of any residue deposited by the first mixture 214. For example, in some embodiments, the second mixture 216 removes about 50% to about 99% of the residue deposited by the first mixture 214. In addition, the use of only carbon dioxide as a cleaning agent advantageously reduces the use of expensive and difficult to dispose of cleaning chemicals and does not etch the substrate 220.

In some embodiments, as depicted in FIGS. 3A-3F, the substrate 220 is held in a stationary position by the substrate support member 218. In the embodiment depicted in FIGS. 3A-3F, the substrate support member 218 may be a baffle which supports the substrate along an outer edge of the substrate 220 while forming a seal around the outer edge to prevent contaminants 240 loosened from the second side 222 of the substrate 220 and carbon dioxide particles from the first mixture 214 and the second mixture 216 from reaching the first side 236 of the substrate 220.

Figure 3A:
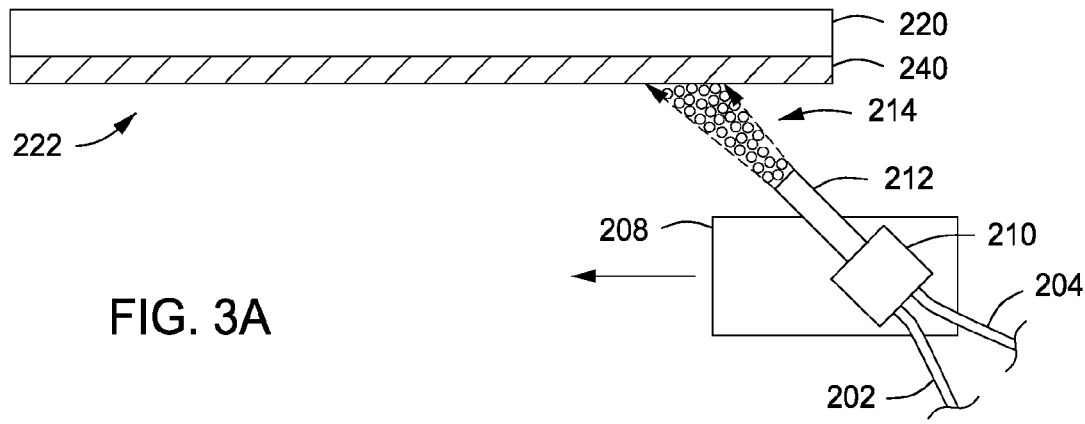
FIGS. 3A-3F depict a stationary substrate in various stages of cleaning in accordance with some embodiments of the present invention.
Figure 3B:
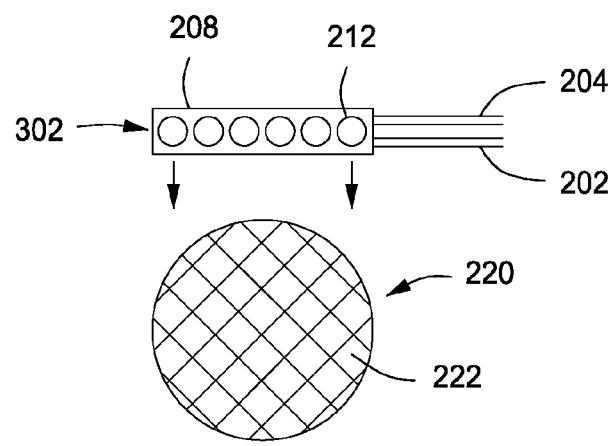
Figure 3C:
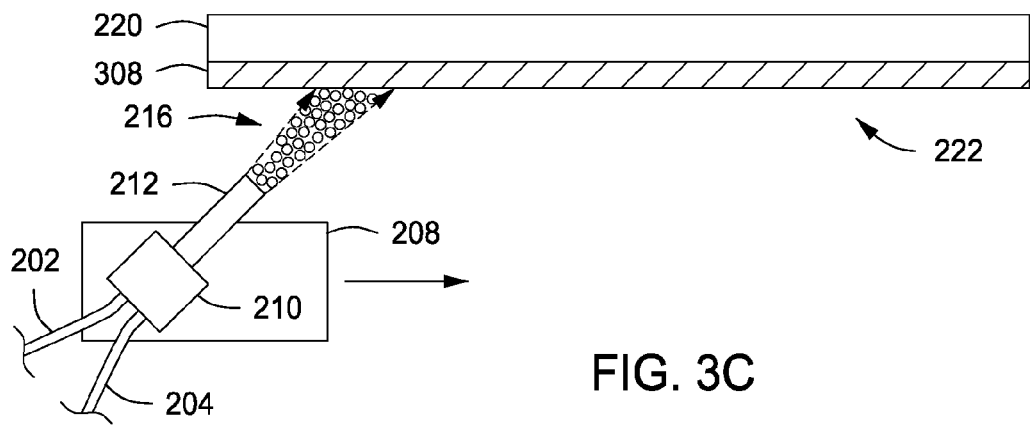

In some embodiments where the substrate 220 is held in a stationary position, as depicted in FIGS. 3A-3C, a plurality of first nozzles 212 forms an array of first nozzles 302 coupled to a moveable arm 208 which traverses the diameter of the substrate 220. In some embodiments, the array of first nozzles 302 is arranged linearly along the length of the movable arm 208. In some embodiments, the array of first nozzles 302 is arranged non-linearly along the length of the movable arm 208. As the moveable arm 208 traverses the diameter of the substrate 220, the array of first nozzles 302 dispenses the first mixture 214 over the entire surface area of the second side 222 to remove contaminants 240. Once the contaminants 240 have been removed, or substantially removed, the array of first nozzles 302 dispenses the second mixture 216 over the entire surface area of the second side 222 to remove at least some residue 308 left by the first mixture 214.

Figure 3D:
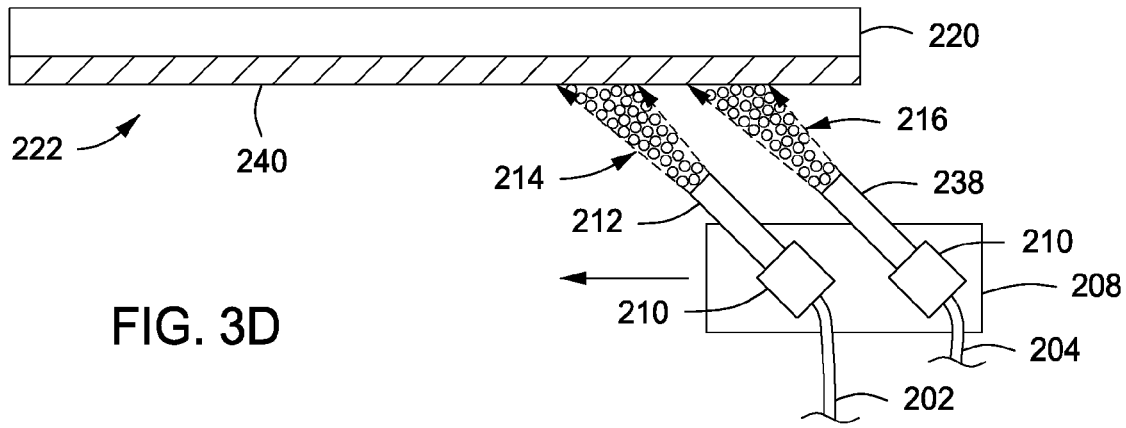
Figure 3E:
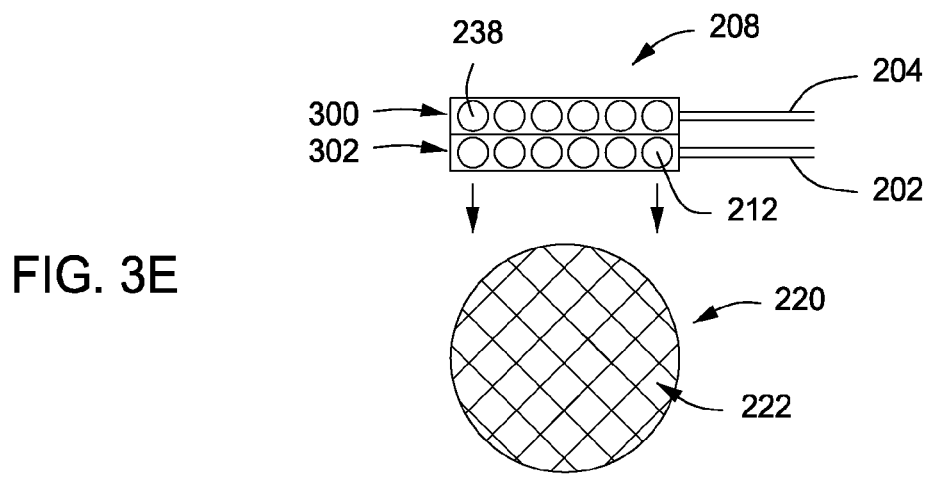
Figure 3F:
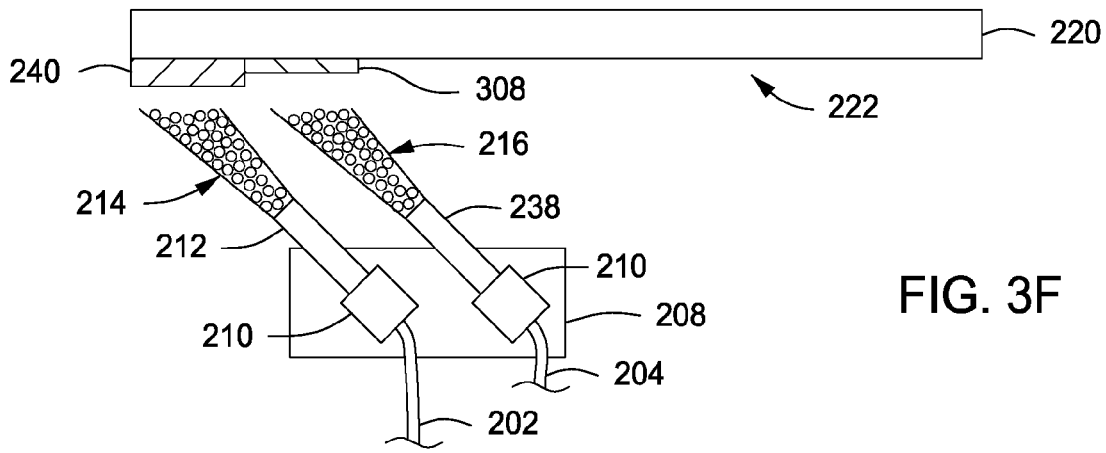

In some embodiments where the substrate 220 is held in a stationary position, as depicted in FIGS. 3D-3F, a plurality of first nozzles 212 forms an array of first nozzles 302 and a plurality of second nozzles 238 forms an array of second nozzles 300. In some embodiments, the array of first nozzles 302 and the array of second nozzles 300 are coupled to a moveable arm 208 which traverses the diameter of the substrate 220. In some embodiments, the array of first nozzles 302 is arranged linearly along the length of the movable arm 208 and the array of second nozzles 300 is arranged linearly along the length of the movable arm 208, parallel to the array of first nozzles 302. In some embodiments, the array of first nozzles 302 and the array of second nozzles 300 are arranged non-linearly along the length of the movable arm 208. As the moveable arm 208 traverses the diameter of the substrate 220, the array of first nozzles 302 dispenses the first mixture 214 over the entire surface area of the second side 222 to remove contaminants 240 caused during substrate processing, while the array of second nozzles 300 dispenses the second mixture 216 over the entire surface area of the second side 222 to remove at least some of any residue 308 left by the first mixture 214.

In some embodiments, as depicted in FIGS. 4A-4F, the substrate support member 218 rotates the substrate 220 about a central axis 400. For example, the substrate support member 218 may include a rotatable plate 406 circumscribing the substrate 220 and gripping an outer edge 404 of the substrate 220. The rotatable plate 406 comprises a central opening 408 allowing the first mixture 214 and second mixture 216 to contact the second side 222 of the substrate 220.

Figure 4A:
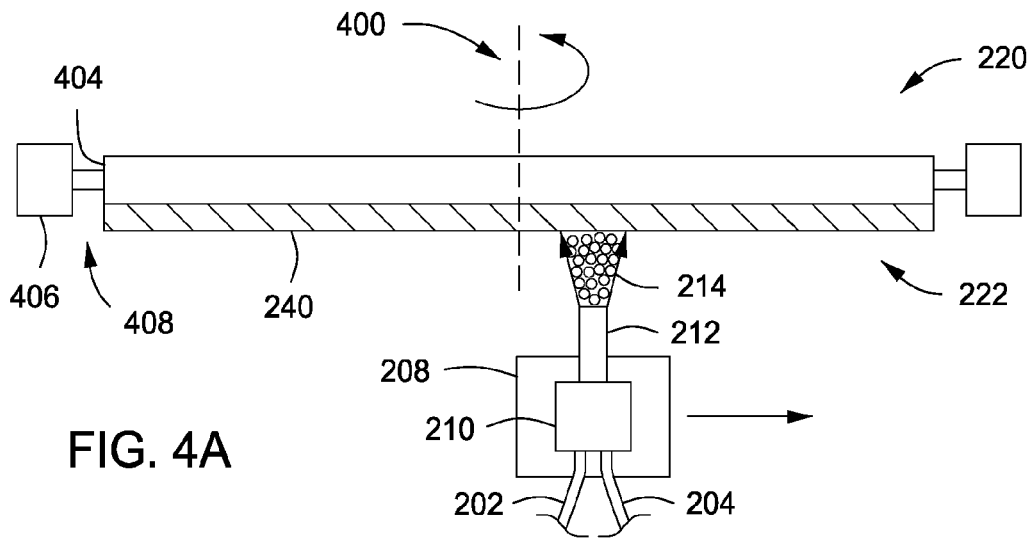
FIGS. 4A-4F depict a rotating substrate in various stages of cleaning in accordance with some embodiments of the present invention.
Figure 4B:
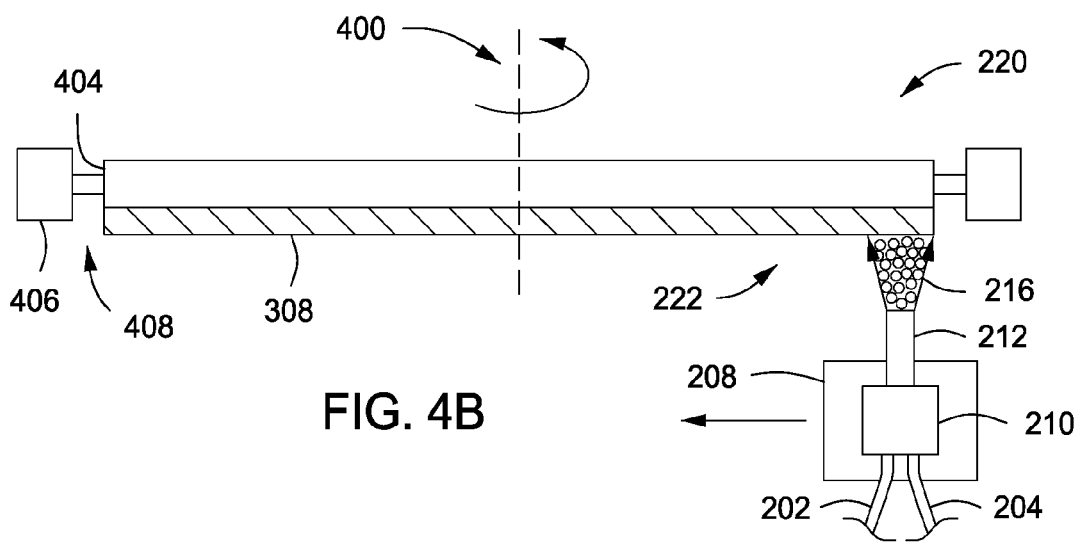
Figure 4C:
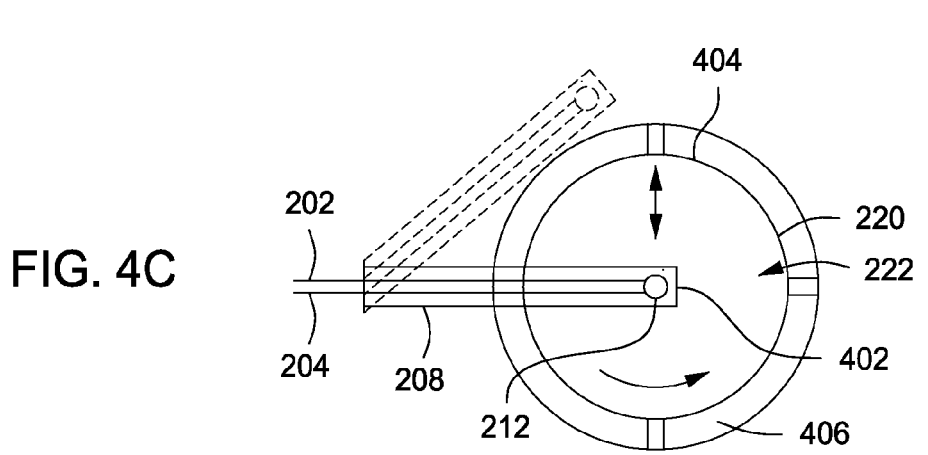

In some embodiments where the substrate 220 rotates as depicted in FIGS. 4A-4C, the first nozzle 212 is coupled to the moveable arm 208 at a first end 402 which is disposed over the central axis 400 of the substrate 220. As the substrate 220 rotates, the moveable arm 208 traverses, for example substantially linearly, from the central axis 400 of the substrate 220 to an outer edge 404 of the substrate 220. As the moveable arm 208 moves toward the outer edge 404 of the substrate 220 the first nozzle 212 dispenses a first mixture 214 onto the second side 222 of the substrate 220 to remove contaminants 240 deposited during substrate processing. Once the contaminants 240 have been removed, or substantially removed, the moveable arm 208 moves toward the central axis 400 of the substrate 220 as the first nozzle 212 dispenses the second mixture 216 over the entire surface area of the second side 222 to remove at least some of the residue 308 left by the first mixture 214. herein.

Figure 4D:
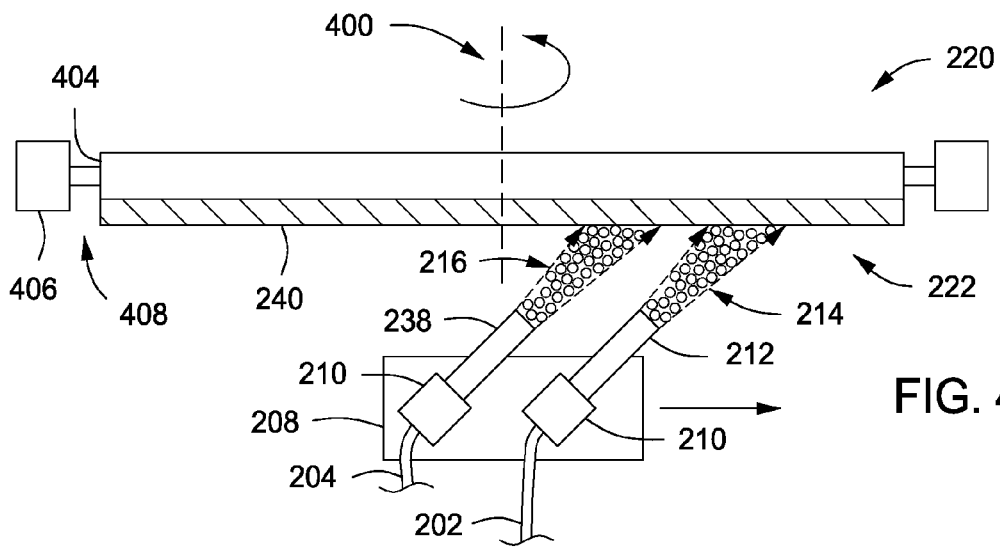
Figure 4E:
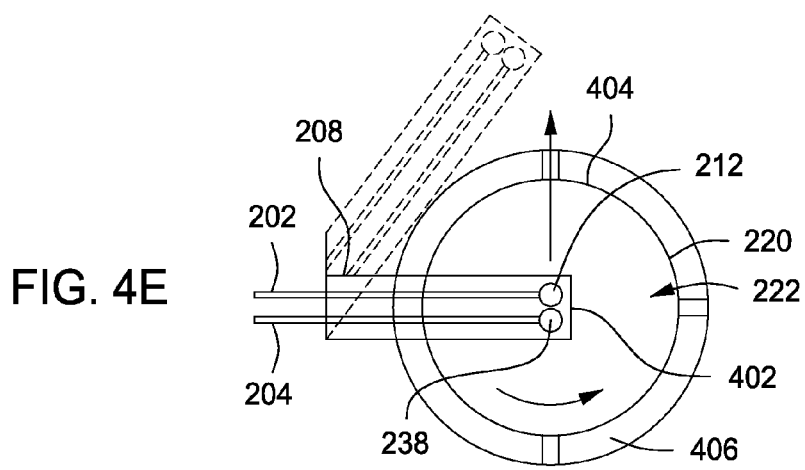
Figure 4F:
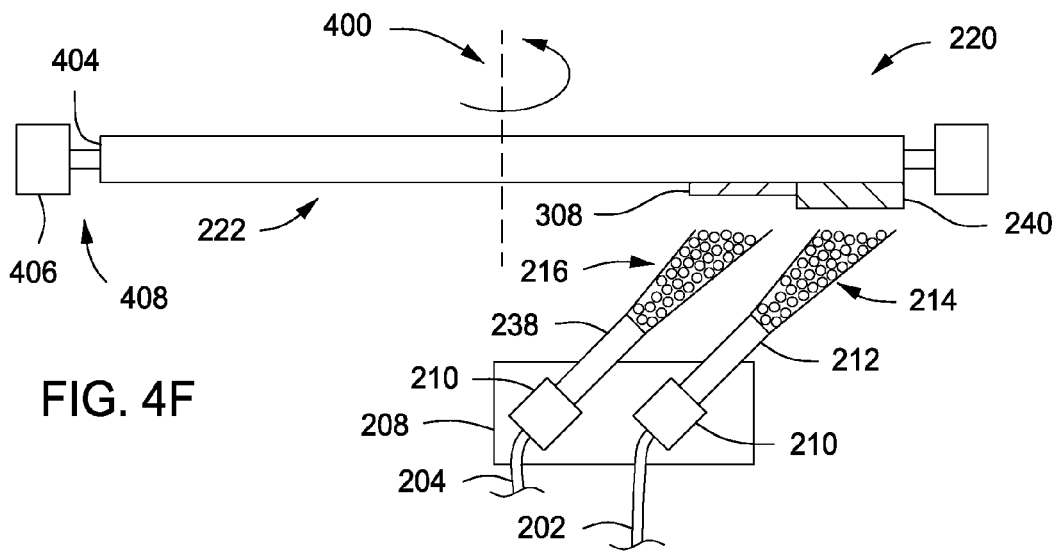

In some embodiments, as depicted in FIGS. 4D-4F, a first nozzle 212 and a second nozzle 238 are coupled to the moveable arm 208 at a first end 402 which is disposed over the central axis 400 of the substrate 220. As the substrate 220 rotates, the moveable arm 208 traverses, for example substantially linearly, from the central axis 400 of the substrate 220 to an outer edge 404 of the substrate 220. As the moveable arm 208 moves toward the outer edge 404 of the substrate 220 the first nozzle 212 dispenses a first mixture 214 onto the second side 222 of the substrate 220 to remove contaminants 240 deposited during substrate processing, while the second nozzle 238 dispenses the second mixture 216 over the second side 222 to remove at least some of any residue 308 deposited by the first mixture 214. In some embodiments, as the moveable arm 208 moves toward the outer edge 404 of the substrate 220 the first nozzle 212 dispenses a first mixture 214 onto the second side 222 of the substrate 220 to remove contaminants 240 deposited during substrate processing and as the moveable arm 208 moves toward the central axis 400 of the substrate 220 the second nozzle 238 dispenses the second mixture 216 over the second side 222 to remove residue 308 deposited by the first mixture 214. The above examples of substrate supports, nozzle configurations, and relative movement therebetween, are illustrative only and other configurations may be utilized to perform the cleaning process as described herein.

Returning to FIG. 2, in some embodiments, a first gas source 226 directs a flow of first gas toward the second side 222 of the substrate 220. In some embodiments, the first gas is air. The air is ionized to advantageously neutralize the substrate 220, which can become charged during the cleaning process. A charged substrate can undesirably cause the substrate 220 to become damaged or to re-attract loosened contamination particles. In some embodiments, the first gas is nitrogen.

In some embodiments, a second gas source 228 directs a flow of second gas toward the first side 236 of the substrate 220. In some embodiments, the second gas may be air or nitrogen gas ($N_2$). The second gas may or may not be ionized. In some embodiments, the second gas flows around the outer edges of the substrate 220 to advantageously create a seal preventing loosened contamination particles and particles from the first mixture 214 and second mixture 216 from contaminating the first side 236 of the substrate 220. In some embodiments, the process chamber 232 comprises an exhaust system 224, fluidly coupled to the first volume 234, to remove loose contaminants and carbon dioxide particles from the first volume 234.

FIG. 1 depicts one exemplary method 100 of cleaning a substrate 220 using the substrate cleaning apparatus 200 described above. In the method 100, a substrate 218 that has been processed through a typical substrate manufacturing process, such as chemical vapor deposition or etching, and has a layer of contamination on the second side 222 of the substrate is placed upon the substrate support member 218.

At 102, a first mixture 214 of solid and gaseous carbon dioxide is directed toward the contaminated second side 222 of the substrate 220. As discussed above, application of the first mixture 214 to the contaminated second side 222 of the substrate 220 removes contaminants 240 from the second side 222. In some embodiments, application of the first mixture 214 removes greater than about 99% of the contaminants 240. However, the first mixture 214 also leaves a first residue upon the second side 222. In some embodiments, 102 can be repeated to provide more complete removal of contaminants 240.

In some embodiments, the second side 222 of the substrate 220 is heated by a heat source 230 prior to directing the first mixture 214 to the second side 222 of the substrate 220.

Heating the substrate 220 advantageously counters cooling of the substrate 220, which may condense water from air directed toward the first side 236 of the substrate 220. Heating the substrate 220 also advantageously prevents thermal stress/strain in the substrate 220. In some embodiments, the second side 222 of the substrate 220 is not heated.

At 104, a second mixture 216 of solid and gaseous carbon dioxide is directed toward the second side 222 of the substrate 220 to remove at least some of the first residue left by the first mixture 214. In some embodiments, application of the second mixture 216 removes about 50% to about 99% of the first residue 308. As discussed above, the second mixture 216 contains less solid carbon dioxide particles, in size as well as in number, than the first mixture 214. Applying a first mixture 214 from a solid carbon dioxide feed source and a second mixture 216 from a gaseous carbon dioxide feed source effectively removes contaminants 240 from the second side 222 of the substrate 220 and removes at least some of the residue deposited by the first mixture 214. In some embodiments, 104 can be repeated in order to provide more complete removal of any residue left by application of the first mixture 214.

In some embodiments, the first nozzle 212 is coupled to the liquid carbon dioxide source 202 and directs the first mixture 214 to the second side 222 of the substrate 220. In some embodiments, the first nozzle 212 is also coupled to the gaseous carbon dioxide source 206. Once the contaminants 240 on the second side 222 are removed, or substantially removed, using the first mixture 214, the first nozzle 212 directs the second mixture 216 to the second side 222 to remove at least some residue left by the application of the first mixture 214.

In some embodiments, the first nozzle 212 is coupled to the liquid carbon dioxide source 202 and a second nozzle 238 is coupled to the gaseous carbon dioxide source 206. In some embodiments, the first nozzle 212 directs the first mixture 214 to the second side 222 of the substrate 220. In some embodiments, after the first mixture 214 has been applied to the entire second side 222, the second nozzle 238 directs the second mixture 216 to the second side 222 of the substrate 220. In some embodiments, while the first nozzle 212 directs the first mixture 214 to the second side 222 of the substrate 220 the second nozzle 238 applies the second mixture 216 to areas of the second side 222 where the first mixture 214 has left a residue.

In some embodiments, a flow of first gas is directed toward the second side 222 of the substrate 220. In some embodiments, the first gas is at least one of air, filtered air, ionized air, or nitrogen.

Figure 5:
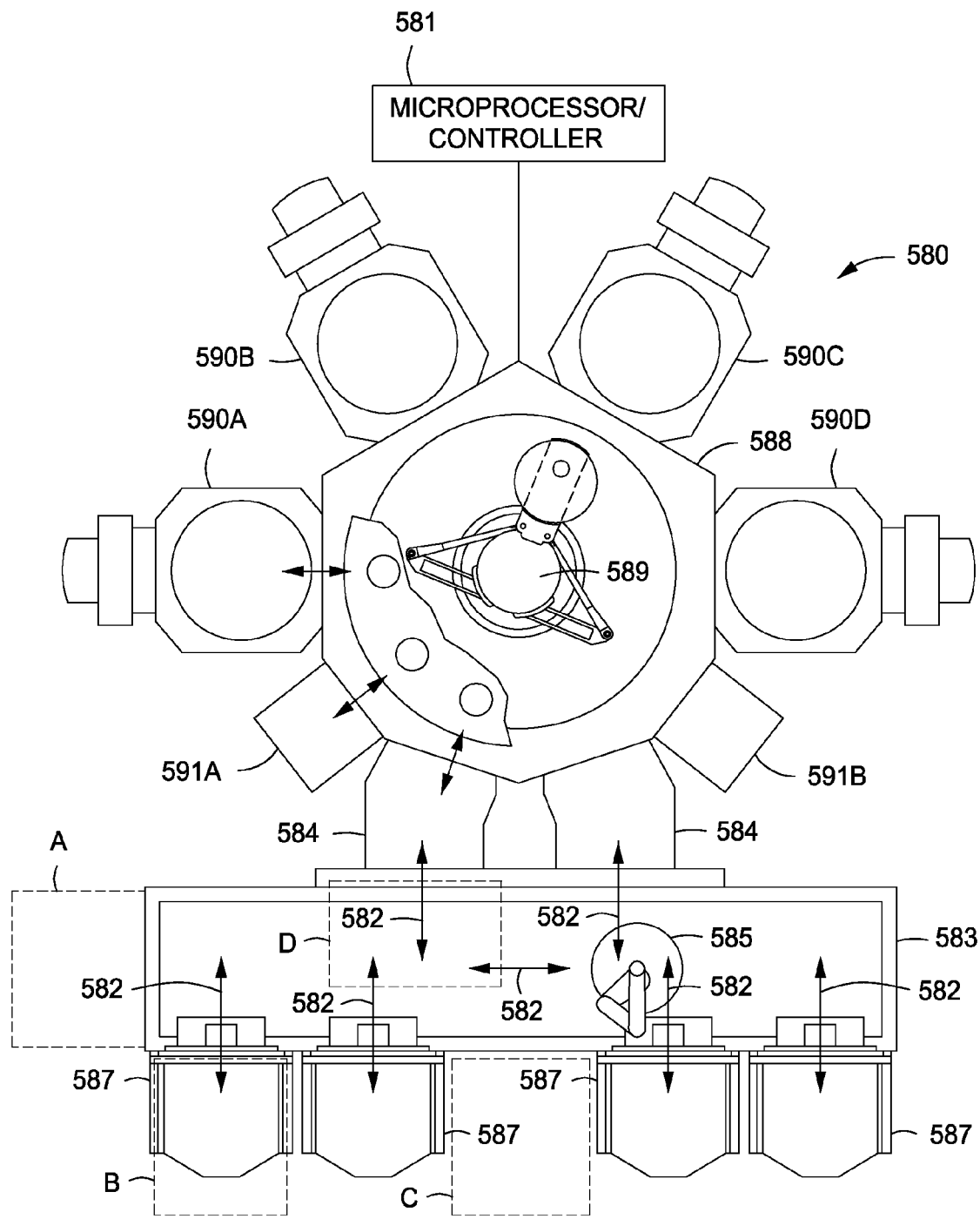
FIG. 5 depicts a depicts a cluster tool suitable for performing portions of the present invention in accordance with some embodiments of the present invention To facilitate understanding, identical reference numerals have been used, where possible, to designate identical elements that are common to the figures. The figures are not drawn to scale and may be simplified for clarity. It is contemplated that elements and features of one embodiment may be beneficially incorporated in other embodiments without further recitation.

FIG. 5 depicts a cluster tool suitable for performing portions of the present invention. Generally, the cluster tool is a modular system comprising multiple chambers (e.g., process chambers 590A-D, service chambers 591A-B, or the like) which perform various functions including substrate cleaning, substrate center-finding and orientation, degassing, annealing, deposition and/or etching. According to embodiments of the present invention, the cluster tool may include at least a substrate cleaning apparatus, as described above, configured to perform the method of cleaning a substrate as described above. Integrating the substrate cleaning apparatus with the cluster tool advantageously prevents cross-contamination from chamber to chamber by performing the cleaning process after every manufacturing step. The multiple chambers of the cluster tool are mounted to a central transfer chamber which houses a robot adapted to shuttle substrates between the chambers. The transfer chamber is typically maintained at a vacuum condition and provides an intermediate stage for shuttling substrates from one chamber to another and/or to a load lock chamber positioned at a front end of the cluster tool.

By way of illustration, a particular cluster tool 580 is shown in a plan view in FIG. 5. The cluster tool 580 generally comprises a plurality of chambers and robots and is preferably equipped with a microprocessor controller 581 programmed to carry out the various processing methods performed in the cluster tool 580. A front-end environment 583 is shown positioned in selective communication with a pair of load lock chambers 584. A pod loader 585 disposed in the front-end environment 583 is capable of linear and rotational movement (arrows 582) to shuttle cassettes of substrates between the load locks 584 and a plurality of pods 587 which are mounted on the front-end environment 583. The load locks 584 provide a first vacuum interface between the front-end environment 583 and a transfer chamber 588. Two load locks 584 are provided to increase throughput by alternatively communicating with the transfer chamber 588 and the front-end environment 583. Thus, while one load lock 584 communicates with the transfer chamber 588, a second load lock 584 communicates with the front-end environment 583. A robot 589 is centrally disposed in the transfer chamber 588 to transfer substrates from the load locks 584 to one of the various processing chambers 590A-D and service chambers 591A-B.

In some embodiments the exemplary method 100 of cleaning contaminants from a substrate, as described above, may be performed in connection with processing the substrate within at least one of the processing chambers. For example, at least one of the processing chambers (for example, any of 590A-D) may be a plasma etch chamber or other process chamber that performs a process on a substrate leading to contaminants begin disposed on the backside of the substrate necessitating removal. Accordingly, for example, following an etch or other process, the substrate may be removed from the plasma etch chamber and transported to the substrate cleaning chamber by the robot 589 and the pod loader 585 to remove contamination caused during the etch process. By providing a cleaning apparatus coupled to the same cluster tool as the process chambers processing the substrate, the substrate may be cleaned as soon as possible after processing, thereby advantageously minimizing contact of the contaminated substrate with processing equipment and migration of the contamination to other components or substrates as well as potentially damaging the substrate or other substrates.

The cleaning apparatus may be located in any of a number of locations on the cluster tool 580. For example, the cleaning apparatus may be disposed on a side of the factory interface, or front-end environment 583, as depicted by dashed box A. Alternatively or in combination a cleaning apparatus may be coupled to or disposed in place of one of the pods 587 coupled to the front-end environment 583, as depicted by dashed box B. Alternatively or in combination a cleaning apparatus may be coupled to or disposed at a central portion of the front-end environment 583, opposite the load locks 584, as depicted by dashed box C. Alternatively or in combination a cleaning apparatus may be coupled to or disposed along an upper surface of the front-end environment 583, as depicted by dashed box D. In positions A-C, the cleaning apparatus may or may not be disposed in a chamber. In position D, the cleaning apparatus may be provided with no chamber and may be configured to clean substrates as they move past the cleaning apparatus between pods 584 and the load locks 584. Other locations or configurations of the cleaning apparatus may also be used.

Thus, improved methods and apparatus for cleaning a substrate have been disclosed herein. The inventive apparatus may advantageously allow for the removal of contamination accumulated on a substrate during the manufacturing process, such as during handling the substrate between process steps and while chucking the substrate inside a process chamber, thereby preventing contaminants from reaching the front-side of a substrate and causing yield loss.

While the foregoing is directed to embodiments of the present invention, other and further embodiments of the invention may be devised without departing from the basic scope thereof.

The invention claimed is:

1. A method of cleaning contaminants from a substrate disposed atop a substrate support member, wherein the substrate has a first side and a second side, the method comprising:
   (a) directing a first mixture of solid and gaseous carbon dioxide from a liquid carbon dioxide source to the second side of the substrate to remove one or more contaminants from the second side of the substrate, wherein the first mixture leaves a first residue; and
   (b) directing a second mixture of solid and gaseous carbon dioxide from a gaseous carbon dioxide source to the second side of the substrate to remove at least some of the first residue, wherein the first mixture contains a greater amount of solid carbon dioxide than the second mixture.

2. The method of claim 1, further comprising:
rotating the substrate while directing the first mixture and the second mixture to the second side of the substrate.

3. The method of claim 2, further comprising:
at least one of dispensing the first mixture and second mixture through a plurality of first nozzles coupled to an arm or dispensing the first mixture through a plurality of first nozzles and dispensing the second mixture through a plurality of second nozzles, wherein the plurality of first nozzles and the plurality of second nozzles are coupled to the arm; and
actuating the arm to move from a center of the rotating substrate to an outer edge of the rotating substrate while dispensing the first and second mixtures.

4. The method of claim 1, wherein the first mixture of solid and gaseous carbon dioxide comprises about 10% to about 50% solid carbon dioxide and about 90% to about 50% gaseous carbon dioxide.

5. The method of claim 1, wherein the second mixture of solid and gaseous carbon further comprises about 1% to about 20% solid carbon dioxide and about 99% to about 80% gaseous carbon dioxide.

6. The method of claim 1, further comprising:
heating the second side of the substrate prior to directing the first mixture and second mixture to the second side of the substrate.

7. The method of claim 1, further comprising:
flowing a first gas toward the second side of the substrate during application of the first mixture and second mixture to the second side of the substrate, wherein the first gas is at least one of air, filtered air, ionized air, or nitrogen.

8. The method of claim 1, further comprising:
repeating (b) to remove at least some of a remaining amount of the first residue from the second side of the substrate.

* * * * *